(12) United States Patent
Flietner et al.

(10) Patent No.: US 6,699,794 B1
(45) Date of Patent: *Mar. 2, 2004

(54) SELF ALIGNED BURIED PLATE

(75) Inventors: Bertrand Flietner, Hopewell Junction, NY (US); Wolfgang Bergner, Wappingers Falls, NY (US)

(73) Assignee: Siemens Aktiengesellschaft (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/037,287

(22) Filed: Mar. 9, 1998

(51) Int. Cl.⁷ ............... H01L 21/302; H01L 21/3065
(52) U.S. Cl. .............. 438/700; 438/703; 438/706; 438/745
(58) Field of Search ............... 438/424, 700, 438/723, 743, 243, 244, 386, 387, 703, 706, 745; 216/17

(56) References Cited

U.S. PATENT DOCUMENTS

| | | | |
|---|---|---|---|
| 4,310,380 A | * | 1/1982 | Flamm et al. ............... 438/719 |
| 4,571,819 A | * | 2/1986 | Rogers et al. ............... 438/430 |
| 4,801,988 A | * | 1/1989 | Kenny ........................ 257/304 |
| 5,022,961 A | * | 6/1991 | Izumi et al. ................ 438/743 |
| 5,406,111 A | * | 4/1995 | Sun ............................ 257/497 |
| 5,422,294 A | * | 6/1995 | Noble, Jr. .................. 438/246 |
| 5,545,583 A | * | 8/1996 | Lam et al. .................. 438/386 |
| 5,618,751 A | * | 4/1997 | Golden et al. ............. 438/392 |
| 5,022,961 A | * | 5/1997 | Izumi et al. ................ 438/743 |
| 5,741,396 A | * | 4/1998 | Loewenstein ............... 438/724 |

* cited by examiner

Primary Examiner—Nadine G. Norton
Assistant Examiner—Lynette T. Umez-Eronini

(57) ABSTRACT

A method of forming a buried plate in a silicon substrate uses a silicon substrate having a deep trench etched into the silicon substrate. A highly doped polysilicon layer is formed within the trench. A nitride layer is then formed within the trench over the polysilicon layer. After forming both the polysilicon layer and the nitride layer, both the polysilicon layer and the nitride layer are etched from a certain uppermost portion of the sidewalls of the trench thereby exposing the silicon substrate at the uppermost portions of the sidewalls. After exposing the silicon substrate at the uppermost portions of the sidewalls, a collar oxide layer is formed over the exposed silicon substrate at the uppermost portions of the sidewalls thereby protecting any edges of the polysilicon layer exposed by the etching step.

16 Claims, 11 Drawing Sheets

US 6,699,794 B1

SELF ALIGNED BURIED PLATE

BACKGROUND OF THE INVENTION

The present invention relates generally to the manufacture of integrated circuits (ICs). More specifically, the invention relates to a method of manufacturing self aligned buried plates within a deep trench formed into a silicon substrate.

Buried plate structures formed within deep trenches that are etched into a silicon substrate are commonly used in the integrated circuit industry. These buried plate structures may be used to, for example, form integrated circuit components such as trench capacitors that may be used as memory storage nodes in devices such as DRAMs. However, the conventional vertical patterning processes used to produce these buried plates are relatively complex and, as described in more detail below, are not self-aligning. In order to more clearly illustrate these problems, a prior art process for producing a trench capacitor on a silicon wafer will be described with reference to FIGS. 1–19.

As indicated in FIG. 1, a silicon wafer 100 is provided having a deep trench 102 etched into wafer 100. Wafer 100 typically has a thin pad oxide layer 104 and a pad nitride layer 106 formed on a top surface 108 of a silicon substrate 110. As is known in the art, pad oxide layer 104 acts as a stress relieving layer for preventing pad nitride layer 106 from separating from silicon substrate 110 during subsequent high temperature process steps. Pad nitride layer 106, which is typically about 200 angstroms thick, acts as a protective layer for top surface 108 of substrate 110 during subsequent process steps such as oxidation steps.

Although not illustrated in the figures, trench 102 is formed into wafer 100 using a deep trench etching process. To accomplish this, a Borosilicate glass (BSG) hard mask layer 112 is applied over pad nitride layer 106. BSG hard mask 112 is then patterned with a resist material (not shown) and etched using a conventional hard mask etching process such as a dry etch process using an $CF_4/CF_3$/Argon etchant. One or more etching process opens BSG hard mask layer 112 (as well as pad nitride layer 106 and pad oxide layer 104) in the areas above where deep trench 102 is to be etched. The resist material (not shown) used to pattern hard mask 112 is then removed using well known resist removing processes. Deep trench 102 is then etched using an appropriate etching process such as a dry etch using an $HBr/NH_3/O_2$ etchant. In this case, the deep trench is etched to a level of about 8 microns below top surface 108 of silicon substrate 110 forming trench sidewalls 114 and 116.

As illustrated in FIG. 2, once trench 102 is etched into wafer 100, BSG hard mask layer 112 is removed using any conventional hard mask removal process such as, for example, a vapor phase etching process using HF vapor. At this point, the process steps used to form a buried plate structure within the deep trench begins.

Referring to FIG. 3, the first step in actually forming a conventional buried plate structure involves depositing an arsenic doped silicon tetraethylorthosilicate glass (ASG TEOS) layer 118 over pad nitride layer 106 and over the surfaces of trench 102. As described in more detail hereinafter, ASG TEOS layer 118 is used to provide the arsenic doping for certain regions of silicon substrate 100 during subsequent annealing steps. This layer may be applied using a conventional chemical vapor deposition (CVD) technique and is typically applied at a thickness of, for example, about 40–60 nm.

Once ASG TEOS layer 118 has been applied, it is etched from the top surface of the pad nitride layer and from certain uppermost portions of trench sidewalls 114 and 116 of trench 102. This etching process is accomplished using the process steps illustrated in FIGS. 4–7.

As illustrated in FIG. 4, a resist material 120 is first applied to wafer 100. This resist material fills trench 102 and coats the top surface of wafer 100 with a layer of resist material. Next, as shown in FIG. 5, resist material 120 is recessed or etched back to a desired level within trench 102, in this case, to a level in the range of about 5.5 to 6.5 microns above the bottom of trench 102. This etching back of the resist exposes portions of the ASG TEOS layer at the uppermost portions of the sidewalls 114 and 116 of trench 102. This step is accomplished using a conventional photoresist etching process. As described in more detail hereinafter, this is the step that determines the level of the first vertical patterning step for this process.

Once resist material 120 has been etched back to the desired level, ASG TEOS layer 118 is etched away from the top of wafer 100 and from the exposed portions of sidewalls 114 and 116. A wet etching process using, for example, a BHF etchant is typically used to etch, and slightly over etch, the ASG TEOS layer. After this etching step, ASG TEOS layer 118 may be slightly recessed below the level of the remaining resist as shown in FIG. 6. And finally, this etching process is finished by removing the remaining portions of resist material 120 using a conventional photoresist removal process. Once the resist is removed, only portions of ASG TEOS layer 118 remain with these portions covering the bottom portions of trench 102.

Once the etching process for the ASG TEOS layer is complete, the ASG TEOS layer is annealed as illustrated in FIGS. 8–10. This annealing process produces an arsenic doped region within silicon substrate 110 surrounding the bottom portions of trench 102. This arsenic doped region forms the buried plate structure. In the specific case of a trench capacitor that is being described, this arsenic doped region forms one of the plates of the capacitor.

Prior to the actual annealing step, a cap TEOS layer 122 is deposited over wafer 100 coating trench 102 as illustrated in FIG. 8. Cap TEOS layer 122 is an undoped TEOS or ozone TEOS layer that prevents the arsenic doped TEOS 118 from doping the upper portions of trench sidewalls 114 and 116 and/or to prevent the arsenic dopant from escaping from the trench during the dopant drive anneal step. Cap TEOS layer 122 is applied using a conventional CVD technique and is typically applied at a thickness of, for example, about 400 Angstroms.

After cap TEOS layer 122 is applied, wafer 100 is annealed. During the annealing step, the temperature is elevated for an specific length of time. In this specific case, the temperature is raised to about 1050 degrees F. for a period of about 30 minutes. This high temperature moves the arsenic from ASG TEOS layer 118 into the surrounding region of silicon substrate 110 thereby forming a buried plate structure 124 within a region of silicon substrate 110 surrounding the bottom portion of trench 102. This process is illustrated in FIG. 9. After the annealing step, the remaining portions of ASG TEOS layer 118 and cap TEOS layer 122 are removed. This is accomplished using a conventional process such as, for example a wet etching process using, for example, a BHF etchant.

Once buried plate structure 124 is formed as described above, a nitride layer is formed on the trench walls adjacent to buried plate structure 124 using the process steps illustrated in FIGS. 11–15. This nitride layer acts as a dielectric for the trench capacitor. This process of forming the capacitor dielectric is the second vertical patterning step of the overall process of forming the trench capacitor. As will be described in more detail hereinafter, this second vertical patterning step must be strictly controlled so that the top of the nitride layer is at the proper level relative to buried plate structure 124. Because two separate vertical patterning steps are used to locate the top of the nitride layer relative to the top of buried plate structure 124, these layers are not self-aligned.

Referring now to FIG. 11, the process of forming the capacitor dielectric will be described. As shown in FIG. 11, a nitride layer 126 is deposited over wafer 100 coating trench sidewalls 114 and 116. Nitride layer 126 is formed using a conventional low pressure chemical vapor deposition process and is about, for example, 7 nm thick. In order to improve the quality of nitride layer 126, nitride layer 126 may be reoxidized at this stage using a wet oxidation process. This reoxidizing step reduces any defects in nitride layer 126 by filling any holes with oxide and improves the dielectric properties of nitride layer 126.

Next, an arsenic doped polysilicon material 128 is applied over wafer 100 so that it fills trench 102 as illustrated in FIG. 12. Arsenic doped polysilicon material 128 is typically formed using a layering process in which a layer of undoped polysilicon is laid down, then a layer of arsenic, and then another layer of undoped polysilicon in order to form overall layer 128. These alternating layers, which are not shown in the Figures, are mixed in subsequent high temperature oxide forming steps. After overall arsenic doped polysilicon material 128 is laid down, a conventional planarization step such as chemical-mechanical polish (CMP) is performed which removes polysilicon material 128 from the top surface of wafer 100.

At this point, polysilicon material 128 is recessed or etched to a desired level within trench 102. Polysilicon material 128 is typically etched using a conventional dry etch process such as a reactive ion etching process using $SF_6$ as the reactant. As described briefly above, this etching step is very important because it determines the vertical alignment of the nitride layer relative to the previously formed buried plate structure 124. Therefore, it is critical that this etch process removes the polysilicon material 128 down to a level just slightly below the level of the top of buried plate structure 124 as illustrated in FIG. 14. For example, in this case, the polysilicon material is etched down to a level of about 100 nm below the uppermost portion of the buried plate structure 124. If these two vertically positioned layers are not properly aligned, the trench capacitor may not be able to hold its charge properly resulting in a defective memory cell.

After polysilicon material 128 is etched to the proper level, nitride layer 126 and any exposed reoxidized nitride are etched away from the top surface of wafer 100 and from the uppermost portions of trench sidewalls 114 and 116 as illustrated in FIG. 15. This step uses a conventional nitride etching process such as, for example, a wet etch process using, for example, an HF-glycerol etchant. This nitride etching step exposes silicon substrate 100 at the uppermost portions of trench sidewalls 114 and 116 and completes the process of forming the nitride dielectric layer for the trench capacitor.

The next process involved in forming the trench capacitor is the process of forming a protective oxide layer on the exposed uppermost portions of trench sidewalls 114 and 116. In this case, the protective oxide layer is a two layer structure formed using the steps shown in FIGS. 16–18. The protective oxide layer is used to cover the exposed silicon substrate 100 at the uppermost portions of trench sidewalls 114 and 116, cover the exposed edge of nitride layer 126, and isolate the buried plate structure 124 from the arsenic doped polysilicon 128 which is already in trench 102 as well as additional arsenic doped polysilicon material that will be added in a subsequent process step. Additionally, the high temperature steps associated with forming the protective oxide layer are used to mix the arsenic doped polysilicon material 128.

Referring initial to FIG. 16, the first step in forming the protective oxide layer involves performing a collar oxide forming step. This is done using a conventional collar oxidation process such as a dry oxidation process to form a thin collar oxide layer 130. Collar oxide layer 130 is formed on the exposed uppermost trench sidewalls 114 and 116. However, since the top surface of polysilicon material 128 is also exposed during the collar oxidizing step, collar oxide layer 130 is also formed over the top of polysilicon material 128 as illustrated in FIG. 16. In this case, collar oxide layer 130 is formed to be about 8 nm thick on trench sidewalls 114 and 116. Also, since the collar oxidation step is a high temperature step, this step begins to mix the arsenic and polysilicon making up arsenic doped polysilicon material 128.

After collar oxide layer 130 is formed, an additional collar oxide deposition layer 132 of collar oxide is deposited over wafer 100 such that it coats the unfilled portions of trench 102 as illustrated in FIG. 17. In this case, collar oxide deposition layer 132 is deposited at a thickness ranging from about 30 nm to about 45 nm. The thickness varies depending on the location on wafer 100 because of the varying contours of the wafer. For example, collar oxide deposition layer 132 may be about 45 nm thick on the top surface of wafer 100 and about 30 nm thick on trench sidewalls 114 and 116. Collar oxide deposition layer 132 is applied using a conventional collar oxide deposition process such as a plasma enhanced TEOS process. In this case, this step includes a 20 minute anneal at a temperature of about 1000 degrees F. This anneal step typically slightly thins collar oxide layer 132. As mentioned above for the high temperature collar oxidizing step, this high temperature anneal step further mixes the arsenic and the polysilicon that makes up arsenic doped polysilicon material 128.

The final step in forming the protective oxide layer is illustrated in FIG. 18. This step involves etching away the collar oxide layers from the top of polysilicon material 128 and the top of wafer 100. A conventional oxide etching, process such as a dry etch process using a $CHF_3/He/O_2$ etchant is used to etch the collar oxide layers. This etching step is important because it is critical to make sure that substantially all of the collar oxide layers 130 and 132 are removed from the top of polysilicon material 128 within trench 102. If all of the collar oxide material is not removed, it may cause electrical resistance between the arsenic doped polysilicon material 128 in the bottom of trench 102 and the arsenic doped polysilicon material that is placed over the top of material 128 as described immediately below. This electrical resistance may interfere with the proper functioning of the trench capacitor.

Once the protective oxide layers are formed on uppermost trench sidewalls 114 and 116, the final step in forming the trench capacitor is the step of applying another layer of arsenic doped polysilicon material 134 such that it fills the remaining unfilled portions of trench 102 as illustrated in FIG. 19. Arsenic doped polysilicon layer 134 may be applied in the same multi-layer manner as described above for arsenic doped polysilicon material 128. If this is the case, the arsenic and the polysilicon would be mixed in subsequent process steps that will not be described herein.

The above described process results in a trench capacitor made up of a buried plate structure 124, a nitride dielectric layer 126, and arsenic doped polysilicon material 128 which acts as the second plate of the capacitor. Arsenic doped polysilicon material 134 provides an electrical path for charging the second plate formed by material 128. Although this overall process results in a useful trench capacitor, there are several disadvantages associated with the above described prior art process.

First, as mentioned above, there are two vertical patterning steps which determine the vertical positioning of the various elements of the capacitor. The first vertical patterning step is illustrated best in FIG. 5. This step determines the height within the trench at which the top of the buried plate structure 124 will be located. The second vertical patterning step is best illustrated in FIG. 14. This is the step which determines the height within the trench at which the top of nitride dielectric layer 126 will be located. This step also determines the height within the trench at which the bottom edge of the protective oxide layers 130 and 132 will be vertically located. Because the vertical location of the top of the buried plate structure 124 and the vertical location of the top of the nitride layer 126 are determined in two separate process steps, this overall process is not self-aligning. That is, these two vertical patterning steps must be very closely controlled to insure that theses two layers are properly aligned. This is a difficult process and results in a high cost for producing trench capacitors using this approach. If these vertical layers are not properly aligned, the capacitor may not be able to properly hold its charge resulting in a defective capacitor.

As another disadvantage, the above described process is a complex process including a large number of individual process steps. This large number of steps in itself makes the process expensive and time consuming. For example, the above described process includes multiple high temperature anneal steps. These steps consumes more of the available temperature budget, are time consuming and therefore reduce the throughput of the manufacturing process making the process more costly.

Additionally, as mentioned above, the collar oxide step is important because it is critical to make sure that substantially all of the collar oxide layers 130 and 132 are removed from the top of polysilicon material 128 within trench 102. If all of the collar oxide material is not removed, it may cause electrical resistance problems between the arsenic doped polysilicon material 128 in the bottom of trench 102 and the arsenic doped polysilicon material 134 that is placed over the top of material 128. This electrical resistance may interfere with the proper functioning of the trench capacitor. In order to ensure the proper etching of these collar oxide layers, the top surface of polysilicon material 128 on which the oxide layers are formed should be as level or flat as possible. If there is a substantial concave or V shape to this top surface, the thickness of the collar oxide layers may vary dramatically making it difficult to properly etch all of the collar oxide material from the top surface of polysilicon material 128.

In order to provide a level, flat surface on the top of polysilicon material 128, deep trench 102 may be formed with slightly tapered trench sidewalls. That is, trench 102 is wider at the top of the trench and narrower at the bottom of the trench. This helps ensure that the etching process used to etch back polysilicon material 128 results in a flat and level top surface for the remaining polysilicon material 128. Unfortunately, the use of a tapered trench with a narrower bottom than top causes the capacitance of the trench capacitor formed using the above described process to be less than the capacitance that would be possible if trenches having vertical sidewalls were used.

In view of the foregoing, it is desirable to provide a process for producing a trench capacitor that reduces or eliminates the above described problems associated with the prior art process.

SUMMARY OF THE INVENTION

As will be described in more detail hereinafter, a method of forming a buried plate in a silicon substrate having a deep trench etched into the silicon substrate is herein disclosed. The trench has sidewalls defining the depth of the trench. The method includes the step of forming a highly doped polysilicon layer within the trench. A nitride layer is then formed within the trench over the polysilicon layer. After forming both the polysilicon layer and the nitride layer, both the polysilicon layer and the nitride layer are etched from a certain uppermost portion of the sidewalls of the trench thereby exposing the silicon substrate at the uppermost portions of the sidewalls. After exposing the silicon substrate at the uppermost portions of the sidewalls, a collar oxide layer is formed over the exposed silicon substrate at the uppermost portions of the sidewalls thereby protecting any edges of the polysilicon layer exposed by the etching step.

In one embodiment, the method further includes the step of forming a thin thermal oxide layer within the trench prior to forming the highly doped polysilicon layer. In a specific version of this embodiment, the thin thermal oxide layer is approximately about 15 angstroms thick.

In another embodiment, the highly doped polysilicon layer is doped with arsenic. Preferably, the concentration of the arsenic in the polysilicon layer is greater than about $5E^{19}/cm^3$, the polysilicon layer is approximately about 300 angstroms thick, and the polysilicon layer is formed using a chemical vapor deposition process. For this embodiment, the nitride layer is approximately about 6 nm thick and the nitride layer is formed using a low pressure chemical vapor deposition process.

In another embodiment which includes the thermal oxide layer, the step of etching the polysilicon layer and the nitride layer includes several steps. Before etching the polysilicon layer and the nitride layer, the trench is filled with a resist material. The resist material is then recessed to a certain level within the trench. The nitride layer and the polysilicon layer are then etched with the thermal oxide layer acting as an etch stop. The thermal oxide layer is then etched to expose the silicon substrate at the uppermost portions of the sidewalls of the trench. And finally, any remaining resist material is removed from the trench. In one version of this embodiment, the trench is formed approximately about 8 microns deep within the silicon substrate and the resist material is recessed to a level of approximately about 5.5 to 6.5 microns above the bottom of the trench.

In another embodiment, the method is used to form a trench capacitor in a silicon substrate for use in a DRAM device. In this embodiment, the portions of the polysilicon layer that remain after the etching step are used to form a buried plate forming part of the trench capacitor. The portions of the nitride layer that remain after the etching step are used to form a dielectric layer for the trench capacitor.

In this embodiment, the trench is filed with doped polysilicon after the step of forming the collar oxide. Portions of the doped polysilicon fill act as a second plate for the trench capacitor.

BRIEF DESCRIPTION OF THE DRAWINGS

The features of the present invention may best be understood by reference to the following description of the presently preferred embodiments together with the accompanying drawings.

DETAILED DESCRIPTION OF THE INVENTION

An invention is herein described for providing methods for manufacturing a trench capacitor within a deep trench formed into a semiconductor wafer, such as a silicon wafer.

The trench capacitor is used in integrated circuits (ICs) including memory ICs such as random access memories (RAMs), dynamic random access memories (DRAMs), synchronous DRAMs (SDRAMs), merged DRAM-logic circuits (embedded DRAMs), or other circuits.

Typically, numerous ICs are formed on the wafer in parallel. After processing is finish, the wafer is diced to separate the integrated circuits to individual chips. The chips are then packaged, resulting in a final product that is used in, for example, consumer products such as computer systems, cellular phones, personal digital assistants (PDAs), and other electronic products.

The invention utilizes fewer vertical patterning steps which makes the process self-aligning thereby eliminating the problems associated with controlling the vertical alignment of various layers of the trench capacitor formed during different vertical patterning steps.

In the following description, numerous specific details are set forth in order to provide a thorough understanding of the present invention. However, in view of this description, it will be obvious to one skilled in the art that the present invention may be embodied in a wide variety of specific configurations. Also, well known integrated circuit manufacturing processes such as processes used to deposit various layers of material on a silicon substrate, etching processes, and other such conventional integrated circuit manufacturing processes will not be described in detail in order not to unnecessarily obscure the present invention.

For illustrative purposes, the present invention will be described using the example of a trench capacitor formed into a deep trench within a silicon wafer. In the example described herein, the trench capacitor is used as a memory storage node of a DRAM device. Although this example shows specific elements positioned at specific dimensional locations, it should be understood that the present invention is not limited to this specific configuration. Instead, the present invention would equally apply to any device which includes the use of a buried plate structure formed within a deep trench using the inventive method regardless of the specific configuration of the various features or regardless of the various elements formed onto the wafer after the buried plate structure is formed within the deep trench.

Figure 1:
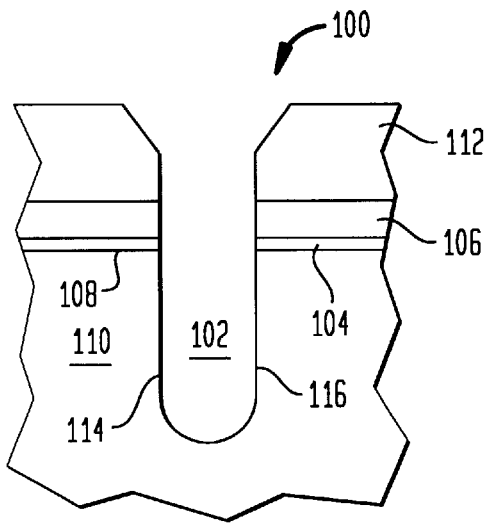
FIG. 1 is a diagrammatic partial cross-sectional view of a prior art silicon wafer with a deep trench formed into the wafer.
Figure 2:
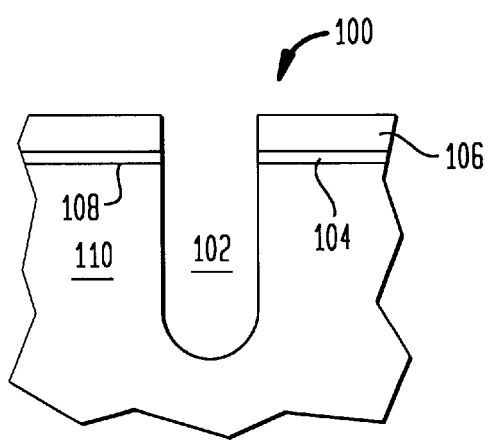
FIG. 2 is a diagrammatic partial cross-sectional view of the silicon wafer of FIG. 1 after a hard mask layer has been removed.
Figure 3:
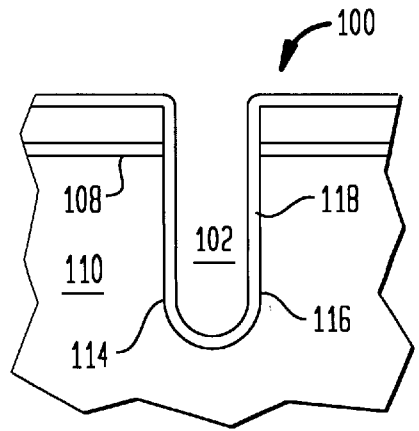
FIG. 3 is a diagrammatic partial cross-sectional view of the silicon wafer of FIG. 2 after an ASG TEOS layer has been applied to the wafer.
Figure 4:
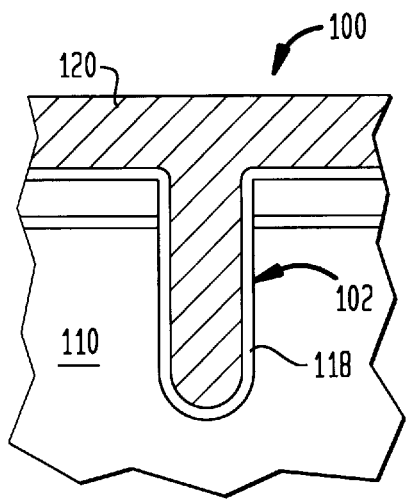
FIG. 4 is a diagrammatic partial cross-sectional view of the silicon wafer of FIG. 3 after a resist layer has been applied to the wafer.
Figure 20:
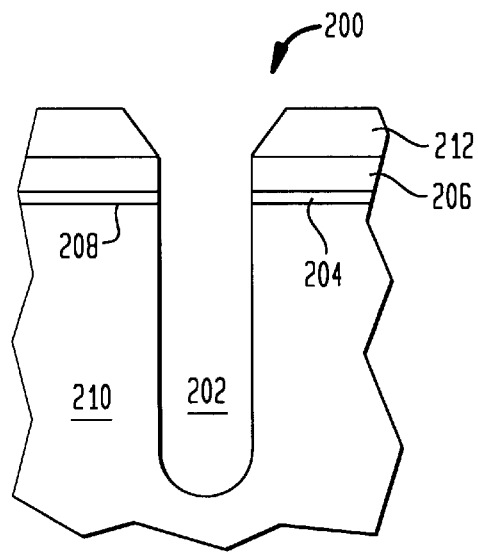
FIG. 20 is a diagrammatic partial cross-sectional view of a silicon wafer with a deep trench formed into the wafer within which a trench capacitor will be formed in accordance with the present invention.

Referring initially to FIG. 20, one embodiment of method for producing a trench capacitor within a deep trench formed into a semiconductor wafer will described. As shown in FIG. 20, a semiconductor wafer 200 is provided having a deep trench 202 etched into wafer 200. Wafer 200, for example, comprises silicon. Other types of semiconductor wafers are also useful. As described in the background with reference to FIG. 1 and wafer 100, wafer 200 typically has a thin pad oxide layer 204 and a pad nitride layer 206 formed on a top surface 208 of a silicon substrate 210. Although this is not a requirement of the invention, pad oxide layer 204 acts as a stress relieving layer for preventing pad nitride layer 206 from separating from silicon substrate 210 during subsequent high temperature process steps. Pad nitride layer 206, which is typically about 200 angstroms thick, acts as a protective layer for top surface 208 of substrate 210 during subsequent process steps such as oxidation steps.

Although not illustrated in FIG. 20, trench 202 is formed into wafer 200 using a deep trench etching process. As described above in the background for wafer 100, a hard mask layer 212 is applied over pad nitride layer 206. The hard mask layer, for example, comprises BSG. Other materials, such as TEOS are also useful to form the hard mask layer. BSG hard mask 212 is then patterned with a resist material (not shown) and etched using a conventional hard mask etching process such as a dry etch process using an $CF_4/CF_3$Argon etchant. This etching process opens BSG hard mask layer 208 in the areas above where deep trench 202 is to be etched. The resist material (not shown) used to pattern hard mask 212 is then removed using well known resist removing processes. Deep trench 202 is then etched using an appropriate etching process such as a dry etch using an $HBr/NH_3/O_2$ etchant. In this case, the deep trench is etched to a level of about 8 microns below top surface 208 of silicon substrate 210 forming trench sidewalls 214 and 216.

Although trench 202 has been described above as being about 8 microns deep, it should be understood that this is not a requirement of the invention. Instead, trench 202 may be any appropriate depth depending on the requirements of the specific application in which the trench capacitor being formed is to be used. In view of the following detailed description of the specific example disclosed herein, those skilled in the art will appreciate the wide variety of specific dimensions the various elements of a buried plate structure may take on and still remain within the scope of the invention.

Figure 21:
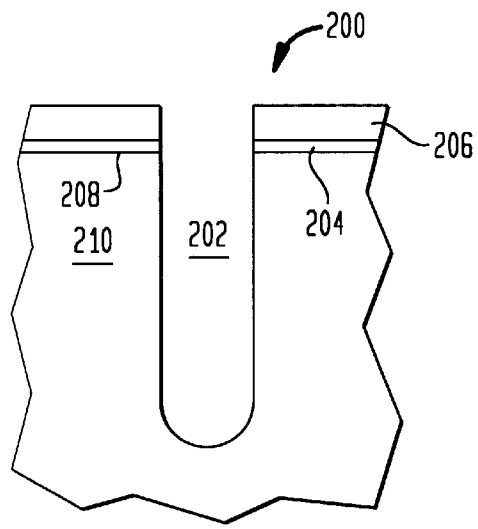
FIG. 21 is a diagrammatic partial cross-sectional view of the silicon wafer of FIG. 20 after a hard mask layer has been removed.

As illustrated in FIG. 21, once trench 202 is etched into wafer 200, BSG hard mask layer 212 is removed using any conventional hard mask removal process as described above in the background. At this point, the process steps used to form the novel buried plate structure of the present invention within the deep trench begin.

Figure 5:
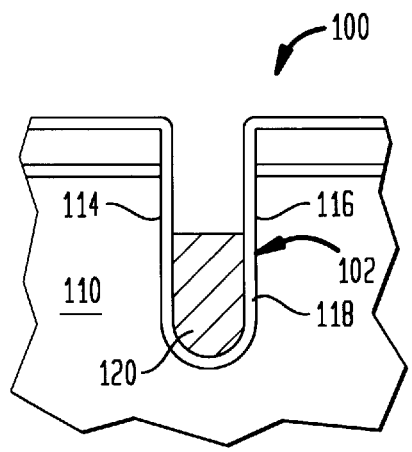
FIG. 5 is a diagrammatic partial cross-sectional view of the silicon wafer of FIG. 4 after the resist layer has been recessed within the deep trench.
Figure 6:
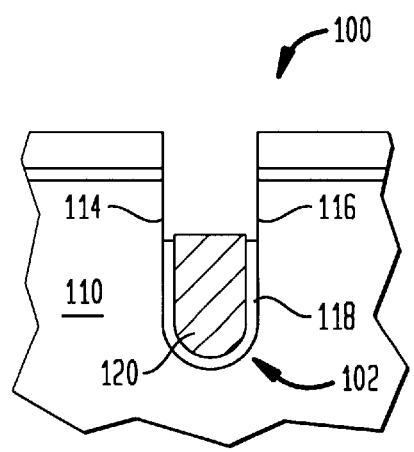
FIG. 6 is a diagrammatic partial cross-sectional view of the silicon wafer of FIG. 5 after the ASG TEOS layer has been etched from the top of the wafer and the exposed portions of the deep trench.
Figure 7:
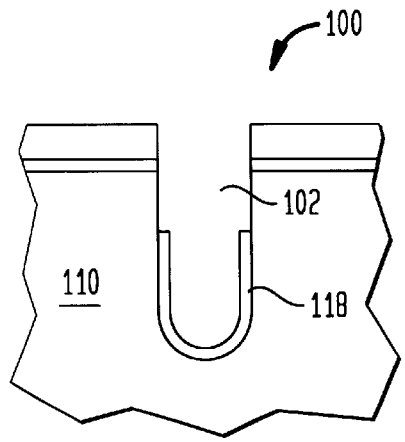
FIG. 7 is a diagrammatic partial cross-sectional view of the silicon wafer of FIG. 6 after the remaining portions of the resist layer have been removed from within the deep trench.
Figure 8:
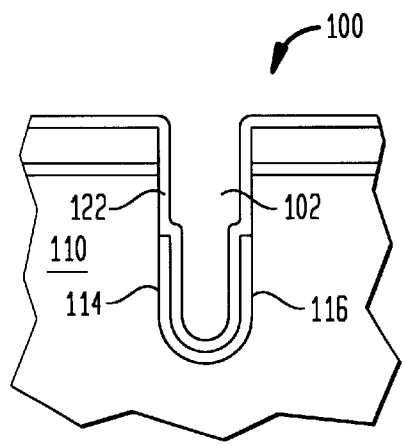
FIG. 8 is a diagrammatic partial cross-sectional view of the silicon wafer of FIG. 7 after a cap TEOS layer has been applied over the wafer.
Figure 9:
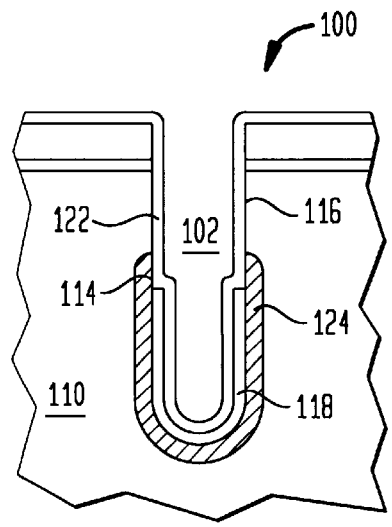
FIG. 9 is a diagrammatic partial cross-sectional view of the silicon wafer of FIG. 8 after the wafer has been through and annealing step.
Figure 10:
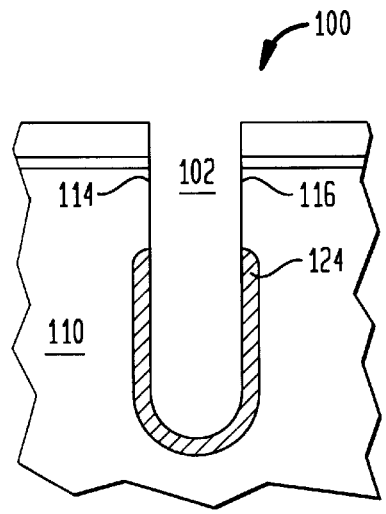
FIG. 10 is a diagrammatic partial cross-sectional view of the silicon wafer of FIG. 9 after the TEOS layers have been etched from within the wafer.
Figure 11:
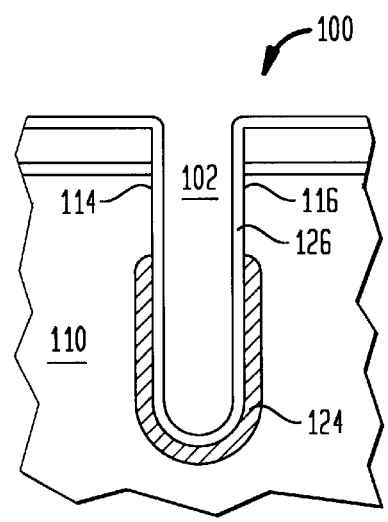
FIG. 11 is a diagrammatic partial cross-sectional view of the silicon wafer of FIG. 10 after a nitride layer has been applied to the wafer.
Figure 12:
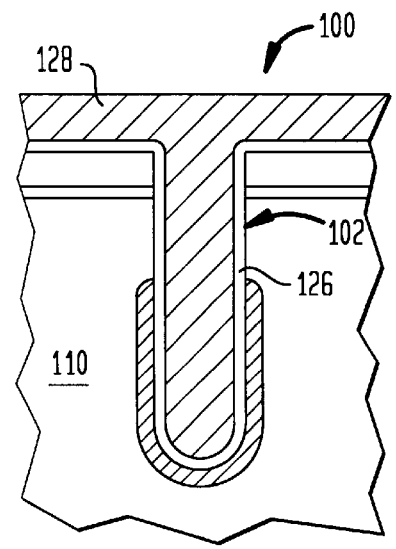
FIG. 12 is a diagrammatic partial cross-sectional view of the silicon wafer of FIG. 11 after a arsenic doped polysilicon layer has been applied to the wafer.
Figure 13:
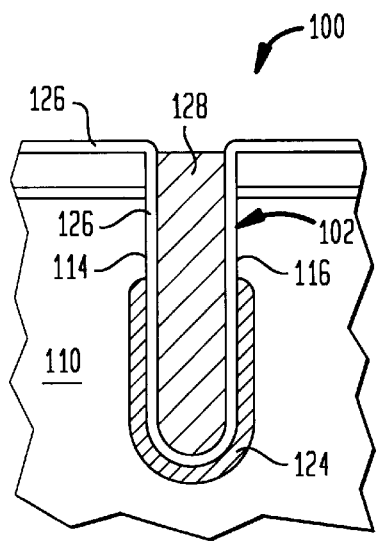
FIG. 13 is a diagrammatic partial cross-sectional view of the silicon wafer of FIG. 12 after the wafer has been planarized.
Figure 14:
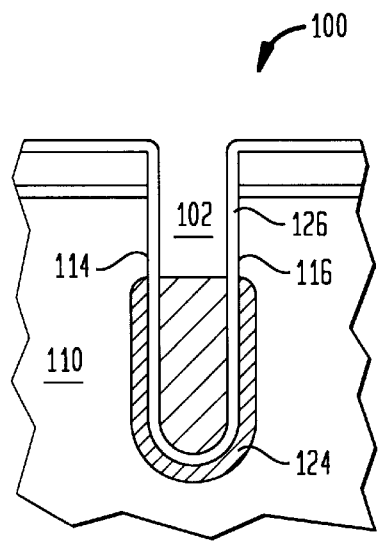
FIG. 14 is a diagrammatic partial cross-sectional view of the silicon wafer of FIG. 13 after the arsenic doped polysilicon material has been recessed within the deep trench.
Figure 15:
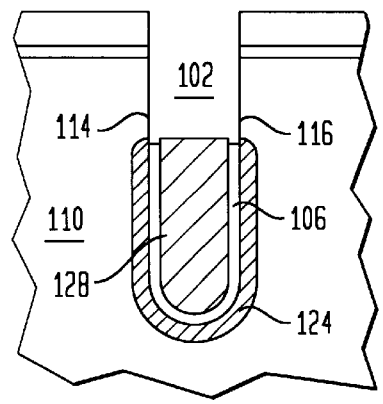
FIG. 15 is a diagrammatic partial cross-sectional view of the silicon wafer of FIG. 14 after the exposed portions of the nitride layer have been etched from the wafer.
Figure 16:
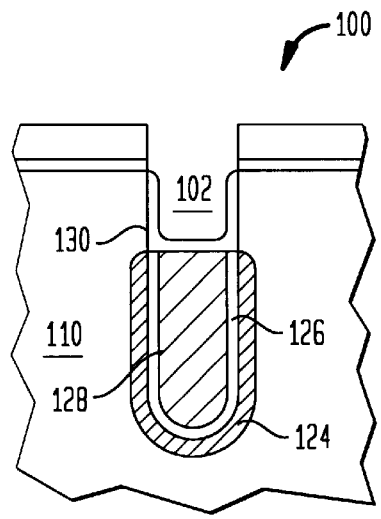
FIG. 16 is a diagrammatic partial cross-sectional view of the silicon wafer of FIG. 15 after a collar oxide layer has been formed on the exposed silicon surfaces of the wafer and the polysilicon material.
Figure 17:
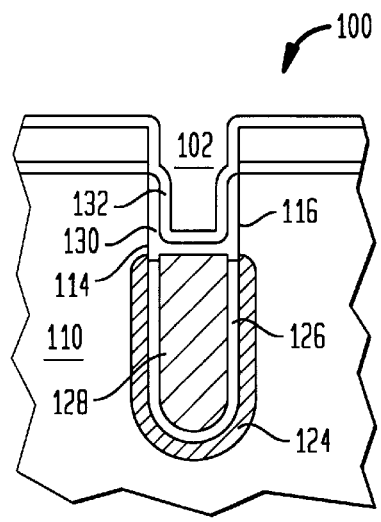
FIG. 17 is a diagrammatic partial cross-sectional view of the silicon wafer of FIG. 16 after an additional collar oxide deposition layer has been formed on the wafer.
Figure 18:
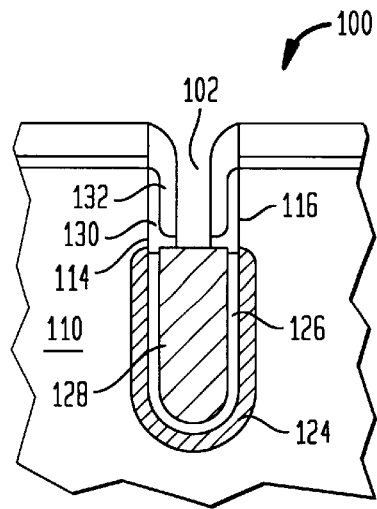
FIG. 18 is a diagrammatic partial cross-sectional view of the silicon wafer of FIG. 17 after the portions of the collar oxide layers have been etched from the top surface of the wafer and the top surface of the polysilicon material.
Figure 19:
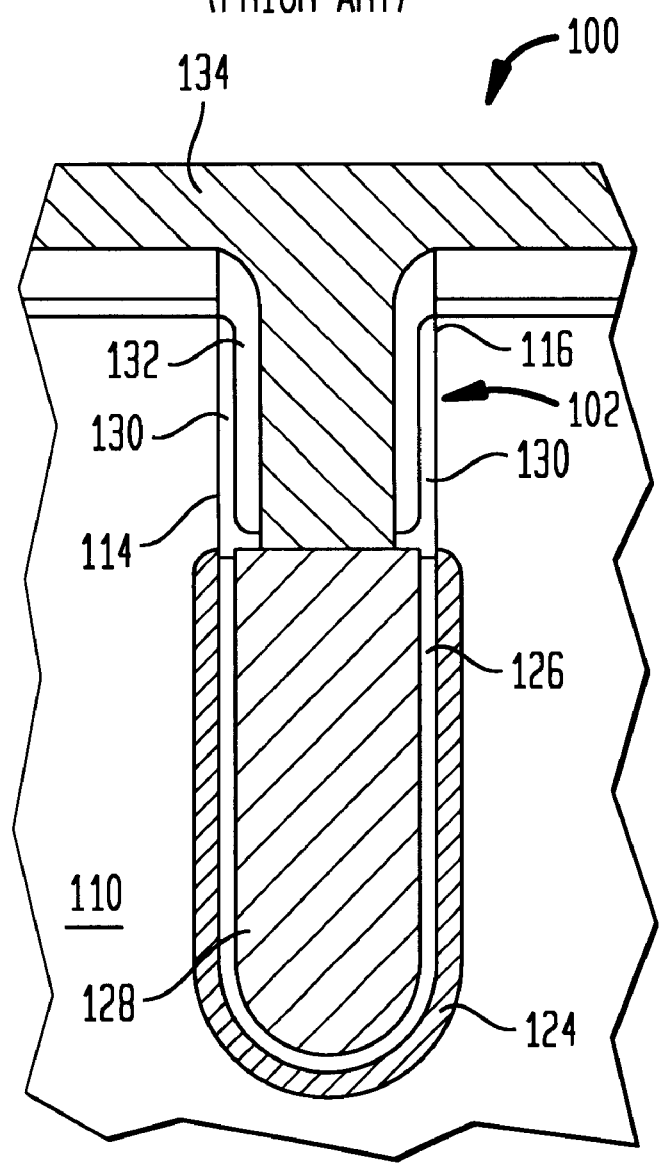
FIG. 19 is a diagrammatic partial cross-sectional view of the silicon wafer of FIG. 18 after another arsenic doped polysilicon layer has been applied to the wafer.

In the prior art approach described above with reference to FIGS. 1–19, the process involved first forming, etching, and annealing the buried plate of the trench capacitor as shown in FIGS. 1–10. Once the buried plate structure is formed, a nitride layer is formed and etched to provide a dielectric layer for the trench capacitor as shown in FIGS. 11–15. As described above, the process of forming the buried plate and the nitride dielectric layer involved two separate vertical patterning steps illustrated in FIGS. 5 and 14. In accordance with the invention, only one vertical patterning step is used. In order to accomplish this, the layers that will be used to form the buried plate and the nitride dielectric layer of the trench capacitor are vertically patterned using the same etching step. Therefore, in accordance with the invention, and as will be described in more detail hereinafter, the junction between the top edges of the buried plate and the nitride layer are self-aligned with the bottom edge of the collar oxide layer.

Figure 22:
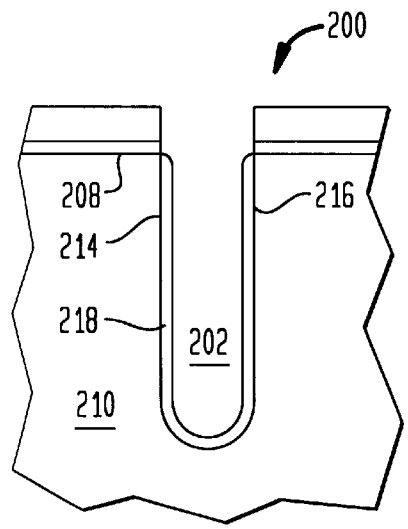
FIG. 22 is a diagrammatic partial cross-sectional view of the silicon wafer of FIG. 21 after a thermal oxidation step has been performed on the wafer.
Figure 23:
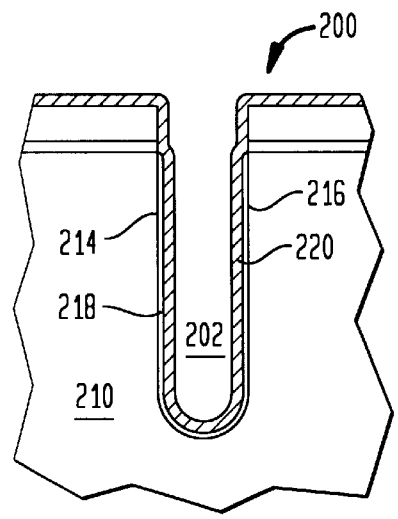
FIG. 23 is a diagrammatic partial cross-sectional view of the silicon wafer of FIG. 22 after a high concentration arsenic doped polysilicon layer has been applied to the wafer.
Figure 24:
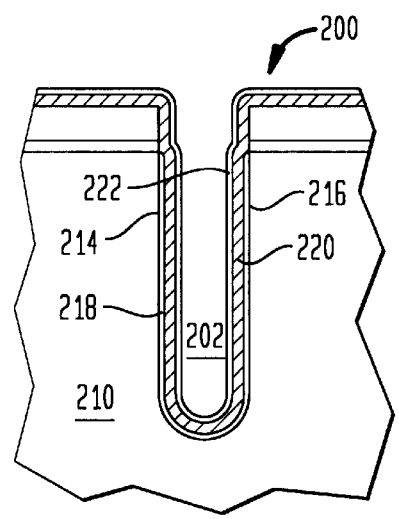
FIG. 24 is a diagrammatic partial cross-sectional view of the silicon wafer of FIG. 23 after a nitride layer has been applied to the wafer.

As mentioned above and in accordance with the invention, the process of applying both the layers that are used to form the buried plate and the nitride dielectric layer of the trench capacitor are applied to wafer 200 prior to any vertical patterning step. FIGS. 22–24 illustrate these steps of applying the various layers.

Initially, a dry thermal oxidation step is performed as shown in FIG. 22. This step forms a thin oxide layer 218 on trench sidewalls 214 and 216. Although this thermal oxidation step is not an absolute requirement of the invention, oxide layer 218 protects trench sidewalls 214 and 216 during subsequent process steps and acts as an etch stop in a subsequent etching step. In this embodiment, oxide layer 218 is formed to be about 10 angstroms to about 20 angstroms thick and is preferably about 15 angstroms thick. Although this specific thickness is given for this example, it should be understood that the invention is not limited thereto. Also, it should be understood that any other conventional oxidation processes other than dry thermal oxidation may be used to form oxide layer 218.

In accordance with the invention, a high concentration n-type doped polysilicon layer 220 is next applied onto wafer 200. In one embodiment, the n-type doped polysilicon layer comprises arsenic. Phosphorus dopants are also useful. As shown in FIG. 23, polysilicon layer 220 is conformally deposited over wafer 200 so that it forms a layer of generally uniform thickness on trench sidewalls 214 and 216 as well as on the top surface of wafer 200. In this embodiment, polysilicon layer 220 is applied at a thickness of about 300 angstroms using a conventional chemical vapor deposition technique well known to those skilled in the art, e.g., low pressure chemical vapor deposition (LPCVD). As will be described in more detail hereinafter, polysilicon layer 220 is used to provide the buried plate element of the trench capacitor being formed within trench 202.

As mentioned above, polysilicon layer 220 is a high concentration arsenic doped polysilicon material. In this embodiment, the concentration of arsenic within the polysilicon is greater than about $5E^{19}/cm^3$. Although this concentration is given as an example for this specific embodiment, it should be understood that the invention would equally apply to polysilicon layers using different concentrations of arsenic or other dopants such as phosphorous or other commonly employed silicon technology dopants.

Once polysilicon layer 220 is applied as described above, a nitride layer 222 is deposited over wafer 200 coating trench sidewalls 214 and 216 as shown in FIG. 24. Nitride layer 222 is formed using a conventional low pressure chemical vapor deposition process similar to that described in the background for nitride layer 126. In this embodiment, nitride layer 222 is deposited at a thickness of, for example, about 6 nm to about 8 nm and preferably about 6 nm. Although this specific thickness is given as an example for this specific embodiment of a trench capacitor, it should be understood that the invention would equally apply to other thickness used in a wide variety of different specific configurations of devices using a buried plate structure. Also, nitride layer 222 may be applied using any conventional process for applying a nitride layer.

In a manner similar to that described above in the background, nitride layer 222 may be reoxidized at this stage using, for example, a wet oxidation process in order to improve the quality of nitride layer 222. This reoxidizing step may be used to reduce any defects in nitride layer 222 by filling any holes with oxide. This improves the dielectric properties of nitride layer 222. As mentioned above, nitride layer 222 acts as a dielectric for the trench capacitor.

Once oxide layer 218, polysilicon layer 220, and nitride layer 222 have been applied, they are etched from certain uppermost portions of trench sidewalls 214 and 216 of trench 102. In accordance with the invention, this etching process is accomplished using only one vertical patterning step and is illustrated in FIGS. 25–29.

Figure 25:
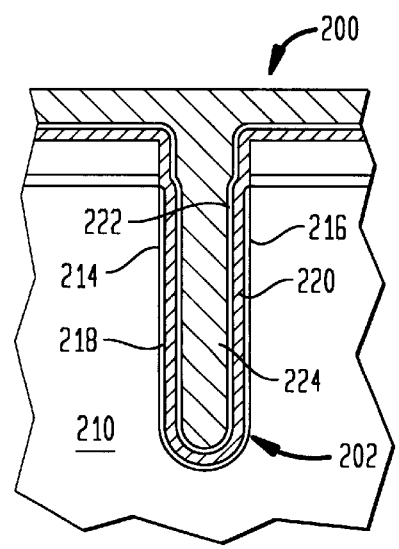
FIG. 25 is a diagrammatic partial cross-sectional view of the silicon wafer of FIG. 24 after a resist layer has been applied to the wafer filling the trench.

As illustrated in FIG. 25, a resist material 224 is first applied to wafer 200. This resist material fills trench 202 and coats the top surface of wafer 200 with a layer of resist material. Any conventional resist material that may be used for the etching of a polysilicon layer and a nitride layer may be used for resist material 224. Also, any conventional method for applying resist material 224, such as using a spin on technique, may be used to apply resist material 224 to wafer 200.

Figure 26:
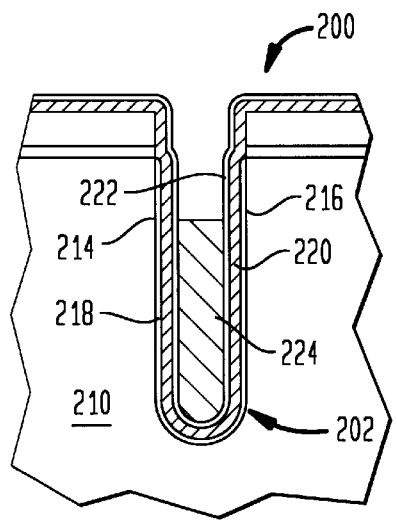
FIG. 26 is a diagrammatic partial cross-sectional view of the silicon wafer of FIG. 25 after the resist layer has been recessed within the deep trench.

Next, as shown in FIG. 26, resist material 224 is recessed or etched back to a desired level within trench 202, removing the resist material from the upper portion of the trench. The upper portion of the trench is where an oxide collar of the trench capacitor is formed and the lower portion is where a buried plate of the trench capacitor is formed. In the case of the specific embodiment being described, resist material 224 is etched back to a level in the range of about 5.5 to 6.5 microns above the bottom of trench 202. Although a specific range is given for the etch back, it should be understood that the invention would equally apply regardless of the specific height the resist material is etched to within the trench.

Etching back of the resist exposes portions of nitride layer 222 at the upper portions of the sidewalls 214 and 216 of trench 202. This step is accomplished using any conventional etching process such as, but not limited to, a wet etching process using a HF-glycerol etchant. This etch step is the only vertical patterning step used in the method of the present invention. Therefore, this step is the step that determines the level of the junction between the bottom edge of the collar oxide layer that will be described hereinafter and the top edges of both the nitride dielectric layer and the polysilicon layer that becomes the buried plate. Since only this one vertical patterning step is used in the method of the invention, the vertically patterned layers of the buried plate devices formed are self-aligning.

Figure 27:
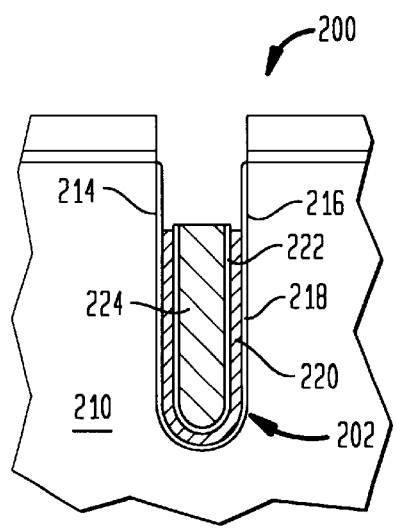
FIG. 27 is a diagrammatic partial cross-sectional view of the silicon wafer of FIG. 26 after the exposed portions of the nitride layer and polysilicon layer have been etched from the wafer.
Figure 28:
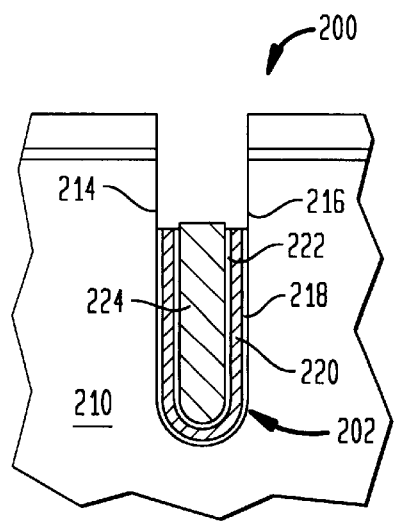
FIG. 28 is a diagrammatic partial cross-sectional view of the silicon wafer of FIG. 27 after the exposed oxide layer has been etched from the sidewalls of the trench.

Once resist material 224 has been etched back to the desired level, both nitride layer 222 and polysilicon layer 220 are etched away from the top of wafer 200 and from the exposed portions of sidewalls 214 and 216 as shown in FIG. 27. Any conventional etching process that is capable of etching the nitride layer and the polysilicon layer may be used. In the specific embodiment being described, a dry etching process using a $NF_3/Cl_2$ etchant is used. Also, in this embodiment, oxide layer 218 is used as an etch stop. This prevents the nitride and polysilicon etching step from etching or damaging the uppermost portions of trench sidewalls 214 and 216. The etching step is completed by etching oxide layer 218 from the uppermost portions of trench sidewalls 214 and 216 as illustrated in FIG. 28. Again, any conventional etching process capable of etching the oxide layer without damaging the uppermost trench sidewalls may be used to etch oxide layer 218. In the embodiment being described, a wet etch process using a BHF etchant is used.

Figure 29:
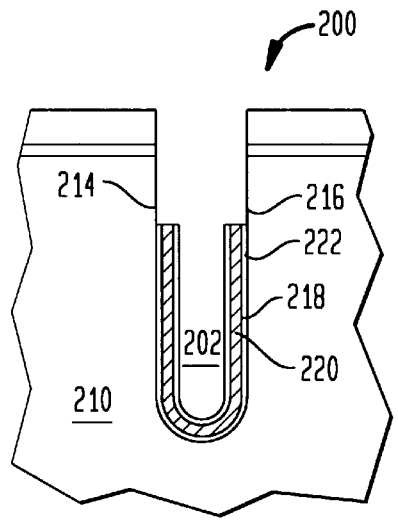
FIG. 29 is a diagrammatic partial cross-sectional view of the silicon wafer of FIG. 28 after the remaining portions of the resist layer have been removed from within the trench.

As a result of the above described etching steps, nitride layer 222, polysilicon layer 220, and oxide layer 218 are slightly recessed below the level of the remaining resist as shown in FIG. 27. At this point, the overall etching process is finished and the remaining portions of resist material 224 are removed using any conventional photoresist removal process. Once the resist is removed, only portions of nitride layer 222, polysilicon layer 220, and oxide layer 218 remain within the trench with these portions of the layers covering the bottom portions of trench 202 as shown in FIG. 29.

Figure 30:
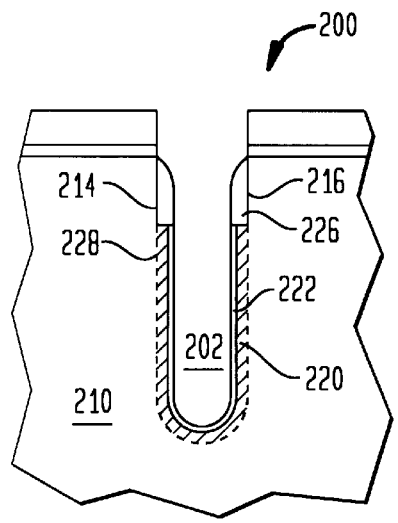
FIG. 30 is a diagrammatic partial cross-sectional view of the silicon wafer of FIG. 29 after a collar oxide layer has been formed on the exposed silicon surfaces of the sidewalls of the trench.

Once the etching process for nitride layer 222 and polysilicon layer 220 are complete, the next step involved in forming the trench capacitor is the process of forming a protective oxide layer on the exposed uppermost portions of trench sidewalls 214 and 216 as illustrated in FIG. 30. The protective oxide layer is used to cover the exposed silicon substrate 210 at the uppermost portions of trench sidewalls 214 and 216 and to cover the exposed edges of nitride layer 222 and polysilicon layer 220. Additionally, the high temperature step associated with forming the protective oxide layer partially breaks down the oxide layer that remains between silicon substrate 210 and arsenic doped polysilicon layer 220.

Referring to FIG. 30, the step of forming the protective oxide layer involves performing a collar oxide forming step. This is done using a conventional collar oxidation process such as a dry oxidation process to form a collar oxide layer 226. Collar oxide layer 226 is formed on the exposed uppermost trench sidewalls 214 and 216. In this case, collar oxide layer 226 is formed to be about 30 nm thick on trench sidewalls 214 and 216. Also, since the collar oxidation step is a high temperature step, this step partially breaks down oxide layer 218 that remains between silicon substrate 210 and arsenic doped polysilicon layer 220 as indicated by dashed line 228. Although collar oxide layer is described as being about 30 nm thick, this is not a requirement of the invention. Instead, the collar oxide layer may be any appropriate thickness depending on the requirements of the specific application and still remain within the scope of the invention.

Figure 31:
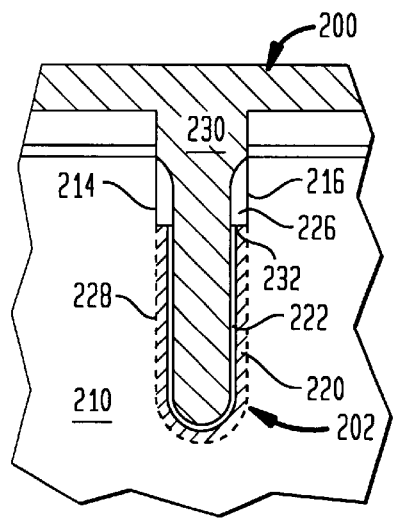
FIG. 31 is a diagrammatic partial cross-sectional view of the silicon wafer of FIG. 30 after another arsenic doped polysilicon layer has been applied to the wafer filling the trench.

After collar oxide layer 226 is formed, another layer of arsenic doped polysilicon material 230 is deposited such that it fills trench 202 as illustrated in FIG. 31. Arsenic doped polysilicon layer 230 may be applied in the same multi-layer manner as described above for arsenic doped polysilicon material 128 and 134. If this is the case, the arsenic and the polysilicon would be mixed in subsequent process steps that will not be described herein. Alternatively, polysilicon layer 230 may be applied in any other conventional manner and still remain within the scope of the invention. The process continues using conventional techniques to complete the trench capacitor and memory cell. Such techniques, for example, is described in Nesbit et al., *A 0.6 $\mu m^2$ 256 Mb Trech DRAM Cell With Self-Aligned BuriEd STrap (BEST)*, *IEDM* 93–627, which is herein incorporated by reference for all purposes. Typically, an array of DRAM cells are interconnected by wordlines and bitlines to form a DRAM chip.

The above described overall process results in a trench capacitor made up of a buried plate structure formed from polysilicon layer 220, a nitride dielectric layer 222, and arsenic doped polysilicon material 230 which acts as the second plate of the capacitor. Arsenic doped polysilicon material 230 also provides an electrical path to the portions of the material 230 that form the second plate. This overall process results in a trench capacitor in which the collar oxide layer 226 and the polysilicon layer 220 and nitride layer 222 are self-aligned in the vertical direction. As described above, this is because only one vertical patterning step is performed in order to produce the trench capacitor. Therefore, this novel method eliminates the problems associated with having multiple vertical patterning steps as described above in the background.

As another advantage, the above described process includes fewer steps than the more complex prior art process described above. This reduced number of steps in itself makes the process less expensive and time consuming compared to the prior art process. For example, the above described prior art process includes multiple etching steps separated by multiple high temperature anneal steps. The large number of steps are time consuming and therefore reduce the throughput of the manufacturing process making the process costly. With the reduced number of steps of the present invention and with the grouping together of the etching steps, the inventive process provides a much less time consuming and therefore less costly process for forming trench capacitors.

Additionally, as described above for the prior art method, the polysilicon material 128 in the bottom of the trench of the prior art device is formed in a separate step than the step employed to form arsenic doped polysilicon material 134. Accordingly, the method of the present invention allows a trench having vertical sidewalls or even overhanging sidewalls to be used without creating this problem of the connection between the two different polysilicon materials. This is because all of the polysilicon plug 230 is formed in one step which results in a continuous polysilicon plug. This completely eliminates the potential problem of forming a bad connection between the two separately applied polysilicon materials. The ability to use trenches with vertical sidewalls or overhanging sidewalls means that the capacitance of a given trench capacitor formed in a trench of a given depth may be larger than would be possible if a trench with tapered sidewalls were used.

Although the trenches and etch back steps have been described as having a particular dimensional relationship with regard to each other and with regard to other elements in the embodiments described, this is not a requirement of the invention. Instead, it should be understood that the present invention would equally apply regardless of the specific dimensional relationships between the depth of the trench and the depth of the etch back step so long as only one vertical patterning step is performed in order to form the trench capacitor.

Although the invention has been described with specific embodiments, it is to be understood that the method of the present invention may be embodied in a wide variety of alternative forms and still remain within the scope of the invention. Any of these various embodiments would equally fall within the scope of the invention so long a single vertical patterning step is used to form the buried plate device. Also, although the wafer has not been described as including additional elements formed on the wafer or within the silicon substrate other than the trench capacitor, it should be understood that the present invention may take on a wide variety of specific configurations incorporating a wide variety of elements formed on the wafer or within the silicon substrate with the various elements being located in a wide variety of positions and mutual orientations and still remain within the scope of the present invention. Therefore, the present examples are to be considered as illustrative and not restrictive, and the invention is not to be limited to the details given herein, but may be modified within the scope of the appended claims.

What is claimed is:

1. A method of forming a buried plate comprising:

etching a trench in a substrate, the trench having sidewalls defining a depth of the trench;

forming a conformal doped polysilicon (poly) layer on the sidewalls and bottom of the trench;

forming a dielectric layer on the conformal doped poly layer in the trench;

removing the conformal doped poly layer and dielectric layer in an upper portion of the trench using a single vertical patterning process to expose the trench sidewalls therein, wherein a remaining portion of the conformal doped poly layer that lines a lower portion of the trench serves as a buried plate, wherein the buried plate is a capacitor electrode; and forming a collar oxide on the exposed trench sidewalls in the upper portion of the trench, the collar oxide lining the exposed sidewalls of the upper portion of the trench.

2. The method of claim 1 further comprises forming an oxide layer on the sidewalls and bottom of the trench prior to forming the conformal doped poly layer.

3. The method of claim 2 further comprises depositing a second doped layer over the substrate to fill the trench, the second doped poly layer being separated from the conformal doped poly layer by the dielectric layer in the lower portion of the trench.

4. The method of claim 3 wherein the second poly layer serve as a second plate of a trench capacitor.

5. The method of claim 4 wherein the trench capacitor is further processed to form a memory cell.

6. The method of claim 1 further comprises depositing a second doped poly layer over the substrate to fill the trench, the second doped poly layer being separated from the conformal doped poly by the dielectric layer in the lower portion of the trench.

7. The method of claim 2 wherein the second poly layer serve as a second plate of the trench capacitor.

8. The method of claim 3 further comprises processing to form a memory cell.

9. The method of claim 2 further comprises removing the oxide layer from the upper portion of the trench to expose the trench sidewalls in the upper portion of the trench.

10. The method of claim 9 wherein the oxide layer is formed by thermal oxidation.

11. The method of claim 1 wherein the dielectric layer comprises nitride.

12. The method of claim 11 further comprises oxidizing the nitride layer to improve the quality of the nitride layer.

13. The method of claim 1 wherein removing the dielectric and the conformal doped poly layers from the upper portion of the trench comprises:

filling the trench with a resist material;

recessing the resist to expose the dielectric layer in the upper portion of the trench and protecting the dielectric layer in the lower portion of the trench;

etching to remove the dielectric and conformal doped poly layers in the upper portion of the trench unprotected by the resist; and removing the resist material in the lower portion of the trench.

14. The method of claim 2 wherein removing the dielectric and the conformal doped poly layers to expose the trench sidewalls comprises:

filling the trench with a resist material;

recessing the resist to expose the dielectric layer in the upper portion of the trench and protecting the dielectric in the lower portion of the trench;

etching to remove the dielectric and conformal doped poly layers in the upper portion of the trench unprotected by the resist, the oxide layer serving as an etch stop to protect the trench sidewalls;

removing the oxide layer to expose the trench sidewalls in the upper portion of the trench; and removing the resist material in the lower portion of the trench.

15. The method of claim 1 wherein the doped poly layer comprises a high dopant concentration.

16. The method of claim 15 wherein the doped poly comprises arsenic of greater than about $5E^{19}/cm^3$.

* * * * *